United States Patent
Cao et al.

(10) Patent No.: US 10,026,912 B1
(45) Date of Patent: Jul. 17, 2018

(54) VERTICALLY INTEGRATED NANOTUBE AND QUANTUM DOT LED FOR ACTIVE MATRIX DISPLAY

(71) Applicant: INTERNATIONAL BUSINESS MACHINES CORPORATION, Armonk, NY (US)

(72) Inventors: Qing Cao, Yorktown Heights, NY (US); Kangguo Cheng, Schenectady, NY (US); Zhengwen Li, Chicago, IL (US); Fei Liu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/407,616

(22) Filed: Jan. 17, 2017

(51) Int. Cl.
*H01L 51/50* (2006.01)
*H01L 51/52* (2006.01)
*H01L 51/56* (2006.01)
*H01L 27/32* (2006.01)
*B82Y 20/00* (2011.01)

(52) U.S. Cl.
CPC ...... *H01L 51/5012* (2013.01); *H01L 27/3262* (2013.01); *H01L 27/3276* (2013.01); *H01L 51/5221* (2013.01); *H01L 51/56* (2013.01); *B82Y 20/00* (2013.01)

(58) Field of Classification Search
CPC ............. H01L 27/3262; H01L 27/3276; H01L 51/5012; H01L 51/5221; H01L 51/56
See application file for complete search history.

(56) References Cited

U.S. PATENT DOCUMENTS

| | | | |
|---|---|---|---|
| 7,569,158 B2 | 8/2009 | Waller et al. | |
| 8,693,087 B2 | 4/2014 | Nowatzyk et al. | |
| 9,006,753 B2 | 4/2015 | Coe-Sullivan et al. | |
| 2005/0045867 A1 | 3/2005 | Ozkan et al. | |
| 2007/0089784 A1 | 4/2007 | Noh et al. | |
| 2010/0051901 A1 | 3/2010 | Kazlas et al. | |
| 2011/0227036 A1* | 9/2011 | Vaufrey | H01L 51/502 257/13 |
| 2015/0243849 A1 | 8/2015 | Stroetmann | |
| 2016/0155970 A1* | 6/2016 | Chung | H01L 51/502 257/40 |
| 2017/0179192 A1* | 6/2017 | Zhang | H01L 27/156 |

FOREIGN PATENT DOCUMENTS

| | | |
|---|---|---|
| CN | 103956424 A | 7/2014 |
| CN | 105304681 A | 2/2016 |
| CN | 105576139 A | 5/2016 |

(Continued)

OTHER PUBLICATIONS

Rinzler et al. "High-performance devices using organic semiconductors," SPIE Newsroom, Sep. 12, 2011.*

(Continued)

*Primary Examiner* — Matthew Reames
(74) *Attorney, Agent, or Firm* — Cantor Colburn LLP

(57) ABSTRACT

A technique relates to a vertical device. A gate is embedded in a transparent substrate. A gate dielectric material is disposed on the gate. A nanotube film is disposed on the gate dielectric material. A quantum dot light emitting diode is disposed on a portion of the nanotube film.

20 Claims, 10 Drawing Sheets

(56) References Cited

FOREIGN PATENT DOCUMENTS

| CN | 105655495 A | 6/2016 |
|---|---|---|
| CN | 105679196 A | 6/2016 |
| CN | 105679954 A | 6/2016 |
| CN | 105679955 A | 6/2016 |
| WO | 2008085210 A2 | 7/2008 |
| WO | 2014116316 A2 | 7/2014 |

OTHER PUBLICATIONS

Ho et al., "Full-colour quantum dot displays fabricated by transfer printing," Nature Photonics 5, DOI: 10.1038/nphoton.2011.12, Feb. 2011, pp. 1-7.

Zhang et al., "Separated Carbon Nanotube Macroelectronics for Active Matrix Organic Light-Emitting Diode Displays," American Chemical Society, dx.doi.org/10.1021/nl202895v, Nano Lett., 2011, pp. 1-7.

* cited by examiner

FIG. 10  1000

FORM AN AN ARRAY OF PIXELS, EACH OF THE PIXELS INCLUDING A GATE EMBEDDED IN A TRANSPARENT SUBSTRATE, A GATE DIELECTRIC MATERIAL DISPOSED ON THE GATE, A NANOTUBE FILM DISPOSED ON THE GATE DIELECTRIC MATERIAL, A QUANTUM DOT LIGHT EMITTING DIODE DISPOSED ON A PORTION OF THE NANOTUBE FILM, A CATHODE LAYER DISPOSED ON THE QUANTUM DOT LIGHT EMITTING DIODE, AND A METAL CONTACT DISPOSED ON ANOTHER PORTION OF THE NANOTUBE FILM 1005

→ FORM GATE LINES IN A FIRST DIRECTION, THE GATE LINES COUPLED TO THE ARRAY OF PIXELS 1010

→ FORM SOURCE LINES IN A SECOND DIRECTION, THE SOURCE LINES COUPLED TO THE ARRAY OF PIXELS 1015

VERTICALLY INTEGRATED NANOTUBE AND QUANTUM DOT LED FOR ACTIVE MATRIX DISPLAY

BACKGROUND

The present invention relates to semiconductor devices, and more specifically, to vertically integrated nanotube and quantum dot light emitting diodes for active matrix display.

Quantum dot light emitting diodes (QD LED, QLED, or QDLED) are considered as a next generation display technology after organic light emitting diode (OLED) displays. QDLEDs are a form of light emitting technology and consist of nanoscale crystals that can provide an alternative for applications such as display technology. The structure of a QDLED is very similar to the OLED technology. However, the difference is that the light emitting centers are quantum dots, such as cadmium selenide (CdSe) nanocrystals. A layer of cadmium-selenium quantum dots is sandwiched between layers of electron transporting organic material and hole transporting organic material. An applied electric field causes electrons and holes to move into the quantum dot layer, where they are captured in the quantum dot and recombine, thereby emitting photons.

SUMMARY

According to one or more embodiments, a vertical device is provided. The vertical device includes a gate embedded in a transparent substrate, a gate dielectric material disposed on the gate, a nanotube film disposed on the gate dielectric material, and a quantum dot light emitting diode disposed on a portion of the nanotube film.

According to one or more embodiments, a method of forming a vertical device is provided. The method includes forming a gate embedded in a transparent substrate, disposing a gate dielectric material on the gate, disposing a nanotube film on the gate dielectric material, and disposing a quantum dot light emitting diode on a portion of the nanotube film.

According to one or more embodiments, a matrix display is provided. The matrix display includes an array of pixels. Each pixel in the array of pixels includes a gate embedded in a transparent substrate, a gate dielectric material disposed on the gate, a nanotube film disposed on the gate dielectric material, a quantum dot light emitting diode disposed on a portion of the nanotube film, a cathode layer disposed on the quantum dot light emitting diode, and a metal contact disposed on another portion of the nanotube film. Also, the matrix display includes gate lines in a first direction, where the gate lines are coupled to the array of pixels, and source lines in a second direction, where the source lines coupled to the array of pixels.

BRIEF DESCRIPTION OF THE DRAWINGS

FIG. 10 is a flow chart of a method of forming an active matrix display according to one or more embodiments.

DETAILED DESCRIPTION

Figure 1:
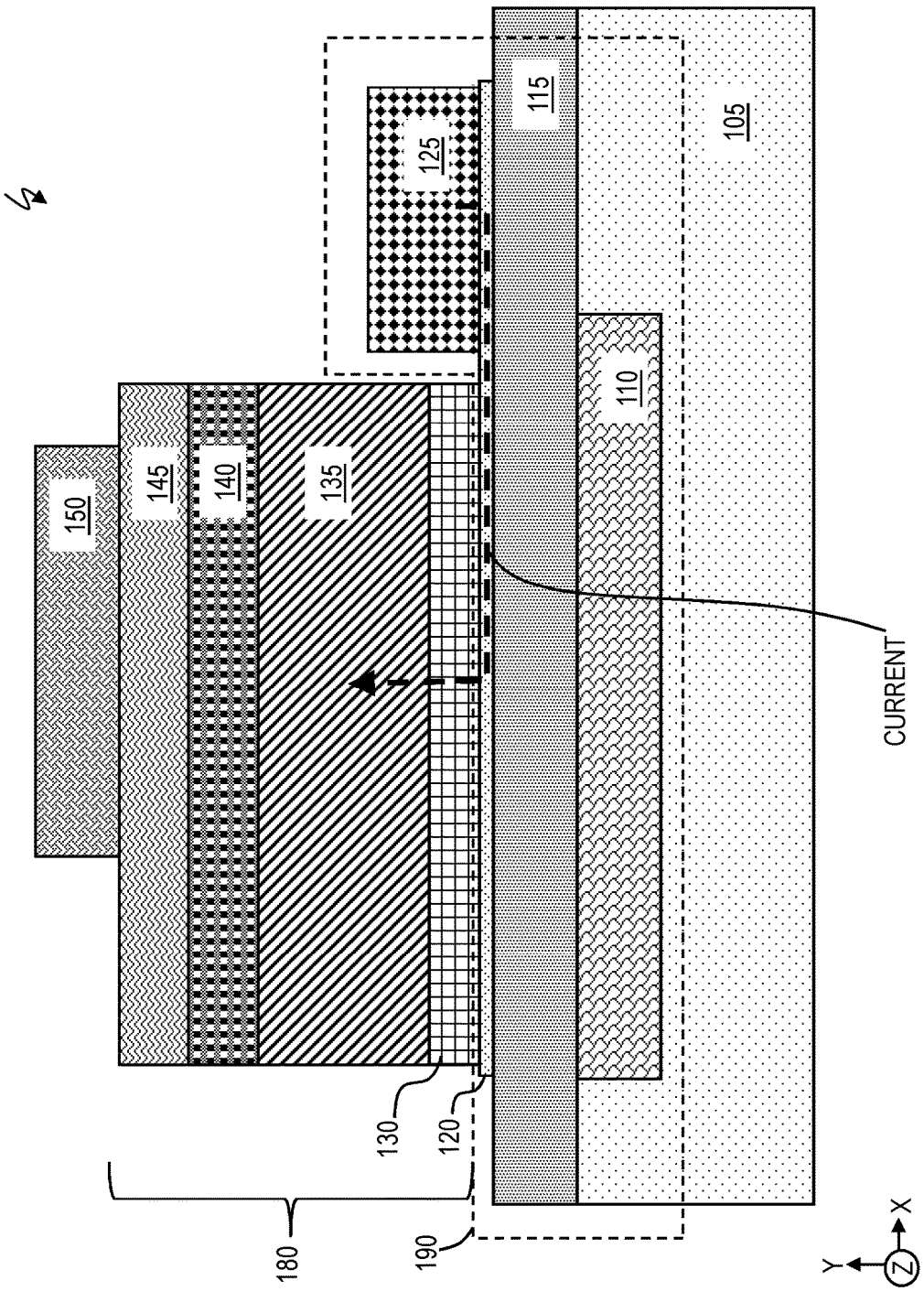
FIG. 1 is a cross-sectional view of a vertical device according to one or more embodiments.

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

QDLED is becoming an important option for the next generation display technology. Although QDLED have numerous benefits, QDLEDs need high drive current/power, making it difficult to drive them using conventional amorphous Si thin-film transistors (TFTs) as in current liquid crystal display (LCD) active matrix displays.

One or more embodiments of the present invention provide a method and structure to make a light emitting transistor based on a semiconducting nanotube thin film and quantum dot LEDs. The high mobility of nanotube thin films allows them to provide enough drive current for the QDLEDs. In addition, this vertically integrated device structure allows easier integration into an active matrix. The vertical device includes a submonolayer of semiconducting nanotubes as the anode of the QDLED. The nanotube film is transparent so that it will not block the light emitting from the quantum dots. The conductivity of the nanotube film can be tuned by an embedded local gate to effectively turn the pixel on or off of the quantum dots.

Turning now to aspects of the present invention, FIG. 1 is a vertical device 100 according to one or more embodiments. The vertical device 100 includes a transparent substrate 105. In one implementation, the transparent substrate 105 can be a glass substrate or plastic substrate. The transparent substrate 105 has an embedded gate 110 formed in the substrate 105. An example material for the embedded gate 110 can be indium tin oxide (ITO).

A gate dielectric material 115 is formed on top of the transparent substrate 105 and the embedded gate 110. Example materials of the gate dielectric material 115 can include silicon dioxide ($SiO_2$), hafnium oxide ($HfO_2$), aluminum oxide ($AlO_2$), etc. The gate dielectric material 115 can include various high-k materials.

A nanotube thin film 120 is formed on top of the gate dielectric material 115. The nanotube film 120 includes numerous carbon nanotubes connected together and/or touching one another in a sheet. The nanotube film 120 is transparent such that light passes through it. The thickness of the nanotube film 120 can range from about 1-6 nanometers (nm).

The nanotube film 120 is a semiconductor such that the nanotube film 120 can be controlled to be a conductive material (i.e., in a conductive state) and controlled to be an insulating material (i.e., in an insulating state or nonconductive state). The nanotube film 120 has a voltage threshold to switch from one state to another state. In one implementation, the nanotube film 120 is structured to be conductive once a voltage threshold is met as applied to the embedded gate 110, and the nanotube film 120 acts as an insulating material prior to reaching the voltage threshold. Conversely, in another implementation, the nanotube film 120 is structured to be an insulator (i.e., in an insulating state or nonconductive state) once a voltage threshold is met, and the nanotube film 120 acts as conductive material prior to reaching the voltage threshold (i.e., in a conductive state). The nanotube film 120 can be formed by drop casting, printing, surface chemistry assisted self-assembly, dry transfer printing, and chemical vapor deposition.

A metal contact 125 is formed on top of a portion of the nanotube film 120. The metal contact 125 can be any conductive material. Examples of the metal contact 125 can include aluminum (Al), copper (Cu), titanium (Ti), tungsten (W), gold (Au), Palladium (Pd), metal alloys, etc.

A hole transport layer 130 is formed on top of another portion of the nanotube film 120. The hole transport layer 130 is configured to permit transfer of holes as understood by one skilled in the art. The hole transport layer 130 can be a polymer. Examples materials of the hole transport layer 130 can include PEDOT:PSS which is poly(3,4-ethylenedioxythiophene)-poly(styrenesulfonate). Other example materials can include molybdenum trioxide ($MoO_3$), tungsten trioxide ($WO_3$), etc.

A quantum dots layer 135 is formed on top of the hole transport layer 130. The quantum dots layer 135 includes quantum dots as understood by one skilled in the art. Quantum dots are very small semiconductor particles, for example, only several nanometers in size. Quantum dots are so small that their optical and electronic properties differ from those of larger particles. Quantum dots emit light of specific frequencies if electricity or light is applied to them, and these frequencies can be precisely tuned by changing the dots' size, shape, and material. Quantum dots can be made of silicon or germanium or made of a compound, such as cadmium sulfide (CdS), cadmium selenide (CdSe), etc.

A hole blocking layer 140 is formed on top of the quantum dots layer 135. The hole blocking layer 140 is designed to prevent holes (positive particles) from traveling upward (in the y-axis) toward the cathode. Example material of the hole blocking layer 140 can be Tris-aluminium (Alq3), bathocuproine (BCP), and 3-(4-biphenylyl)-4-phenyl-5-(4-tert-butylphenyl)-1,2,4-triazole (TAZ).

An electron transport layer 145 is formed on top of the hole blocking layer. Example materials of the electron transport layer 145 can include zinc oxide (ZnO), titanium oxide ($TiO_2$), cesium carbonate ($Cs_2CO_3$), niobium oxide ($Nb_2O_5$), etc.

A cathode layer 150 is formed on top of the electron transport layer 145. The cathode layer 150 is a low work function material. Examples of the cathode layer 150 can be silver magnesium (Ag—Mg), aluminum (Al), etc.

The QDLED 180 is formed of the hole transport layer 130, the quantum dots layer 135, the hole blocking layer 140, and the electron transport layer 145. The anode to the QDLED 180 is the nanotube film 120, and the cathode is the cathode layer 150.

Dashed lines are shown to highlight the vertical transistor 190. The vertical transistor 190 is formed of the embedded gate electrode 110, the gate dielectric material 115, the nanotube film 120, and the metal contact 125. The QDLED 180 and the vertical transistor 190 together form the vertical device 100 which is the vertically integrated nanotube and quantum dot LED device. The vertical device 100 can be representative of one pixel (particularly the QDLED 180), and its understood that a display can have thousands of pixels according to the display size. Each pixel has its own vertical transistor 190 for control along with the cathode 150.

Turning now to operation of the vertical device 100, the cathode layer 150 is connected to a lower voltage potential or negative voltage source such as ground, while the metal contact 125 is connected a higher voltage potential or to a positive voltage source. The embedded gate 110 is connected to gate voltage source to effectively turn on or turn off the voltage device 100 (i.e., turn off the pixel). It is assumed that the nanotube film 120 is in an insulating/nonconductive state (i.e., acts as an insulating material) before the gate voltage threshold is met. When in the insulating state, voltage is applied to the metal contact 125, and very small current (i.e., very small amount of holes) flows to the quantum dots layer 135 because the nanotube film 120 acts as a nonconductor. Accordingly, the QDLED 180 is off and no light is emitted.

Next, a gate voltage is applied to the gate 110, and this gate voltage meets the gate voltage threshold for switching the nanotube film 120 from the insulating state to the conductive state. When in the conductive state, voltage is applied to the metal contact 125 and current (holes) flows to the quantum dots layer 135 because the nanotube film 120 acts as conductor for the current. The holes combine with electrons from cathode 150, such that light is emitted in the quantum dots layer 135 as understood by one skilled in the art. Accordingly, the QDLED 180 has been turned on because the nanotube film 120 is in the conductive state. As can be seen, the gate voltage of the gate 110 controls whether nanotube film 120 is a conductor (i.e., voltage threshold met) or an insulator (i.e., voltage threshold not met).

In another implementation, the relationship between the conductive state and insulating state with respect to the gate voltage threshold being met or not met can be reversed. In this case, the nanotube film 120 can be in a conductive state prior to the voltage threshold being met. As such, the nanotube film 120 is conducting electricity such that the current (from metal contact 125) passes through the nanotube film 120 and the QDLED 180 is turned on (i.e., light is emitted). To turn off the QDLED 180, gate voltage is applied to meet the gate voltage threshold, and this switches the nanotube film 120 from the conductive state to the insulating state, such that no light is emitted.

Chemical modification can be utilized to determine the initial state of the nanotube film 120 prior to the gate voltage being applied to meet the gate voltage threshold to switch the state. For example, doping the nanotube film 120 with charge transfer dopants, such as, for example, Triethyloxonium hexachloroantimonate, can be utilized to effectively adjust the device threshold voltage.

FIGS. 2-7 are cross-sectional views depicting a fabrication process of the vertically integrated nanotube and quantum dot LED device 100 according to one or more embodiments. Standard lithography techniques can be utilized to form the vertical device 100 as discussed herein. Although an example of fabricating one vertical device 100 is illustrated for explanation purposes, it should be appreciated that numerous vertical devices 100 can be made simultaneously, such as an array of vertical devices 100 in an active matrix display.

Figure 2:
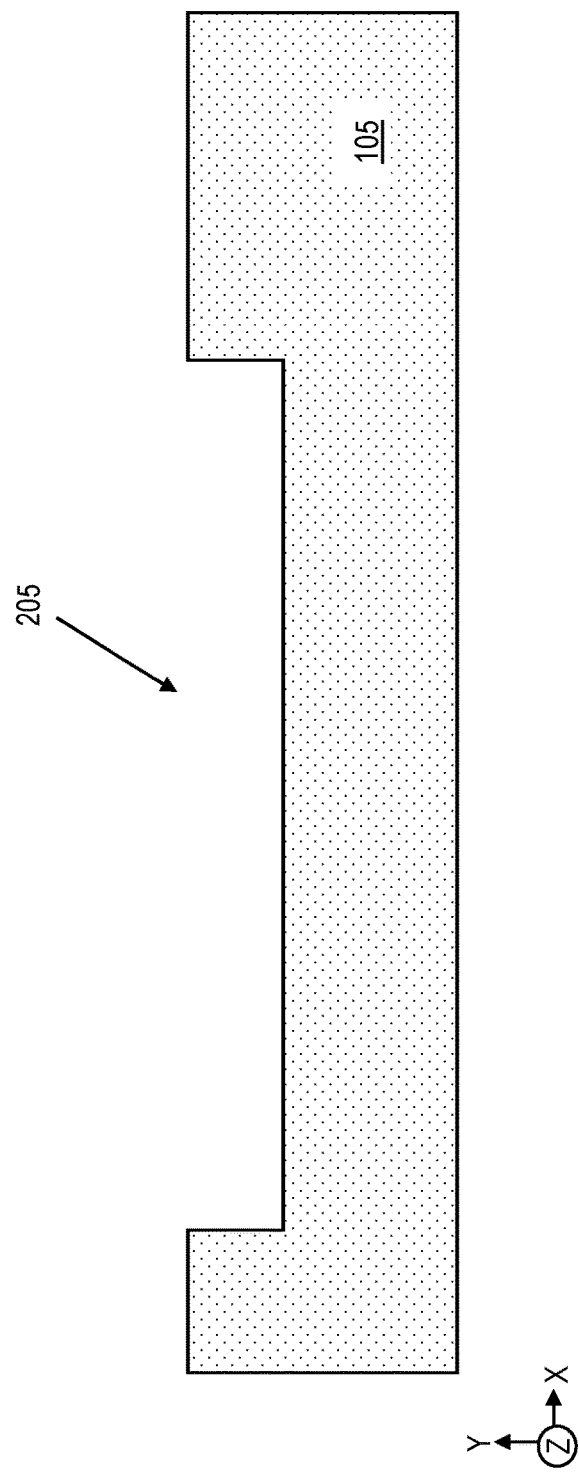
FIG. 2 is a cross-sectional view of the vertical device illustrating a transparent substrate with a trench according to one or more embodiments.

FIG. 2 is a cross-sectional view of the vertical device 100 illustrating the transparent substrate 105 with a trench 205. The trench 205 is etched in the transparent substrate 105 in preparation for the gate electrode 110.

Figure 3:
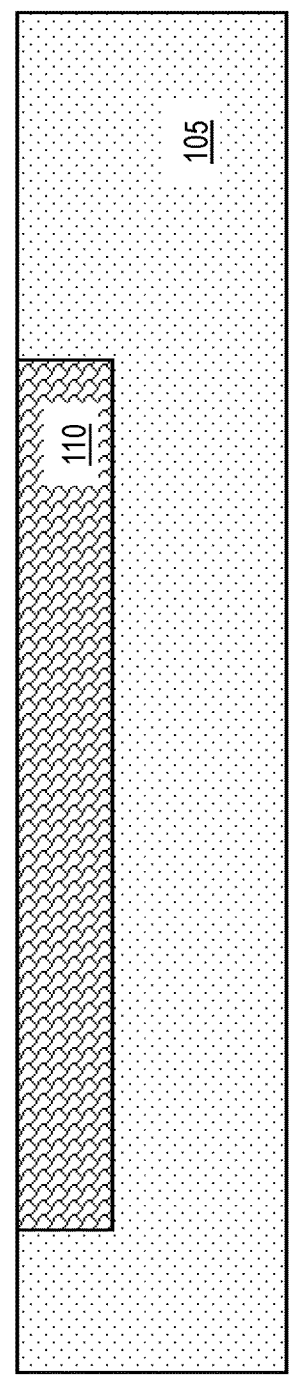
FIG. 3 is a cross-sectional view of the vertical device illustrating deposition of the embedded gate according to one or more embodiments.

FIG. 3 is a cross-sectional view of the vertical device 100 illustrating deposition of the embedded gate 110. Any excess gate material utilized to form the embedded gate 110 is removed. The top surface of the vertical device 100 can be planarized, for example, by chemical mechanical planarization/polishing.

Figure 4:
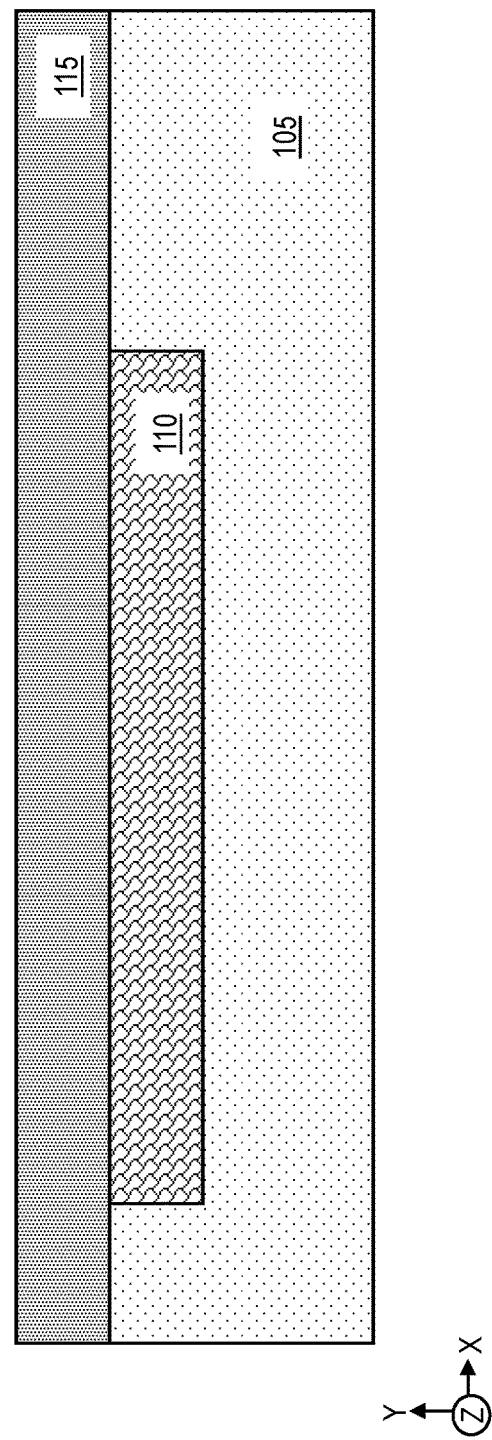
FIG. 4 is a cross-sectional view of the vertical device illustrating deposition of the gate dielectric material according to one or more embodiments.

FIG. 4 is a cross-sectional view of the vertical device 100 illustrating deposition of the gate dielectric material 115. The gate dielectric material 115 is formed on top of both the transparent substrate 105 and embedded gate 110. In one implementation, the gate dielectric material 115 can be patterned to be only on top of the embedded gate 110 and not the transparent substrate 105.

Figure 5:
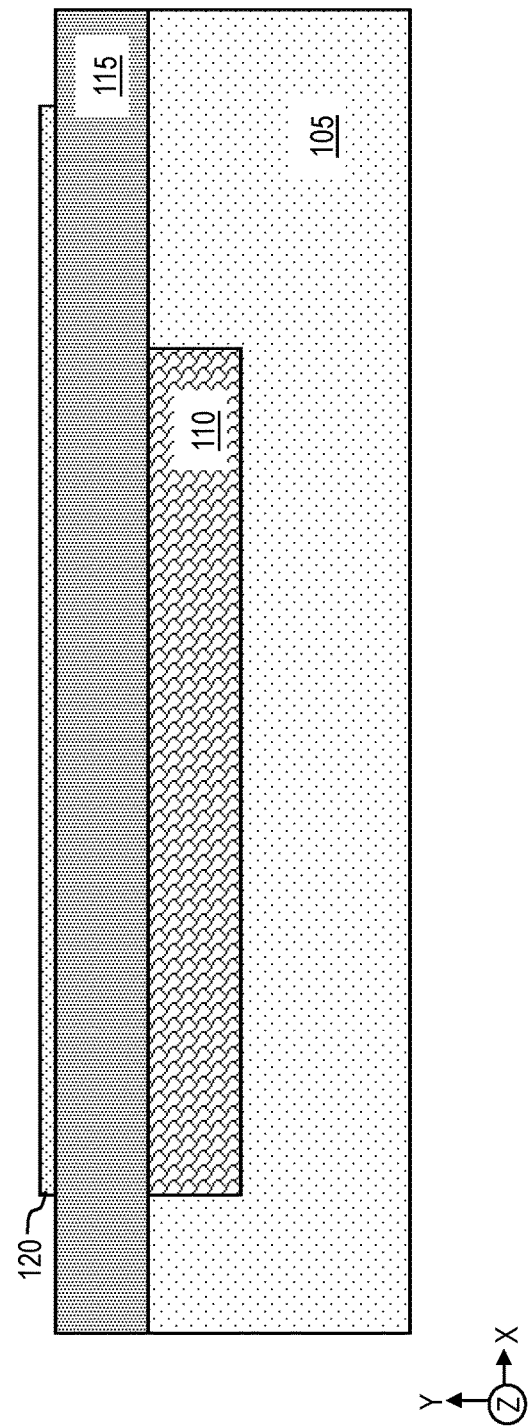
FIG. 5 is a cross-sectional view of the vertical device illustrating deposition of the carbon nanotube thin film according to one or more embodiments.

FIG. 5 is a cross-sectional view of the vertical device 100 illustrating deposition of the carbon nanotube thin film 120. In one implementation, the nanotube film 120 can be deposited by printing. In another implementation, the nanotube film 120 can be deposited from a solution. The nanotube film 120 can be composed of random networks of nanotubes, partially aligned arrays of nanotubes, and/or well aligned arrays where nanotubes are parallel with the electron transport direction. The nanotube density could range from 1 tube per $\mu m^2$ to a full coverage nanotube thin film up to 6 nm thick.

Figure 6:
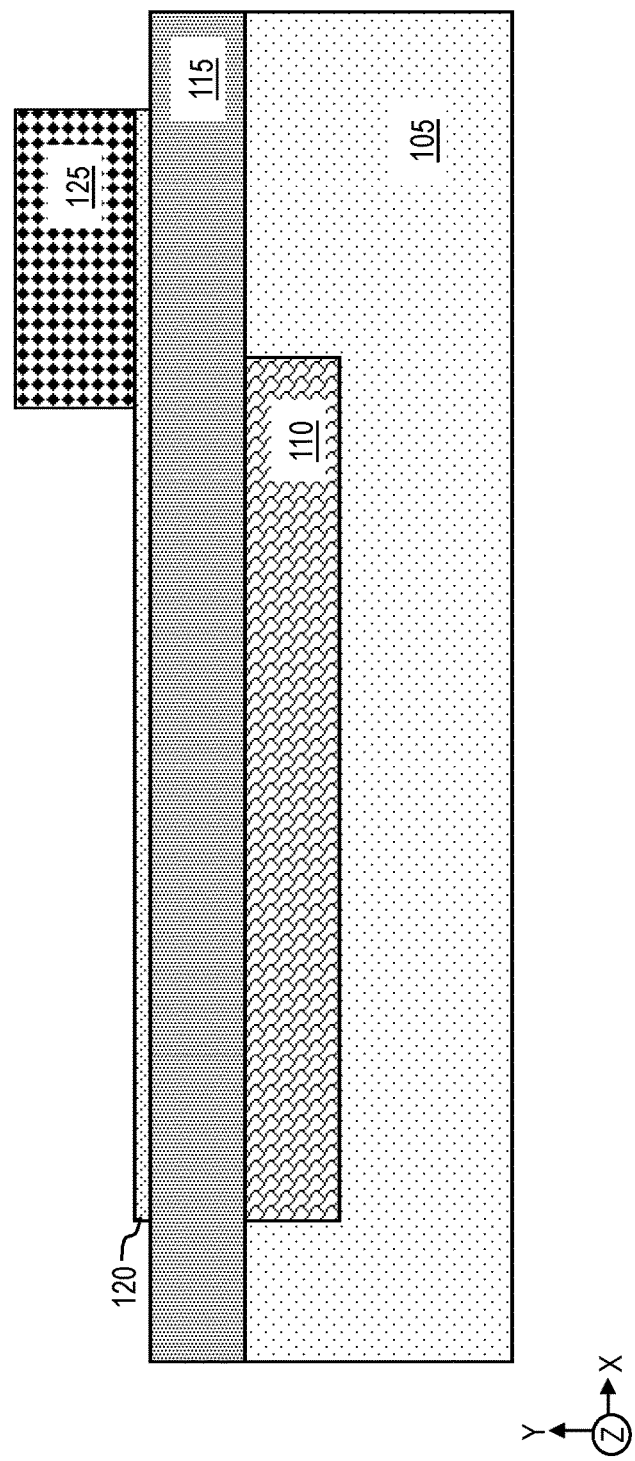
FIG. 6 is a cross-sectional view of the vertical device illustrating formation of the metal contact according to one or more embodiments.

FIG. 6 is a cross-sectional view of the vertical device 100 illustrating formation of the metal contact 125. In one implementation, the metal contact 125 can be formed on one end of the nanotube film 120 by using shadow evaporation. Shadow evaporation uses an evaporation mask that is suspended above the substrate. The evaporation mask can be formed from two layers of resist. Depending on the evaporation angle, the shadow image of the mask is projected onto the desired position to form the metal contact 125.

Figure 7:
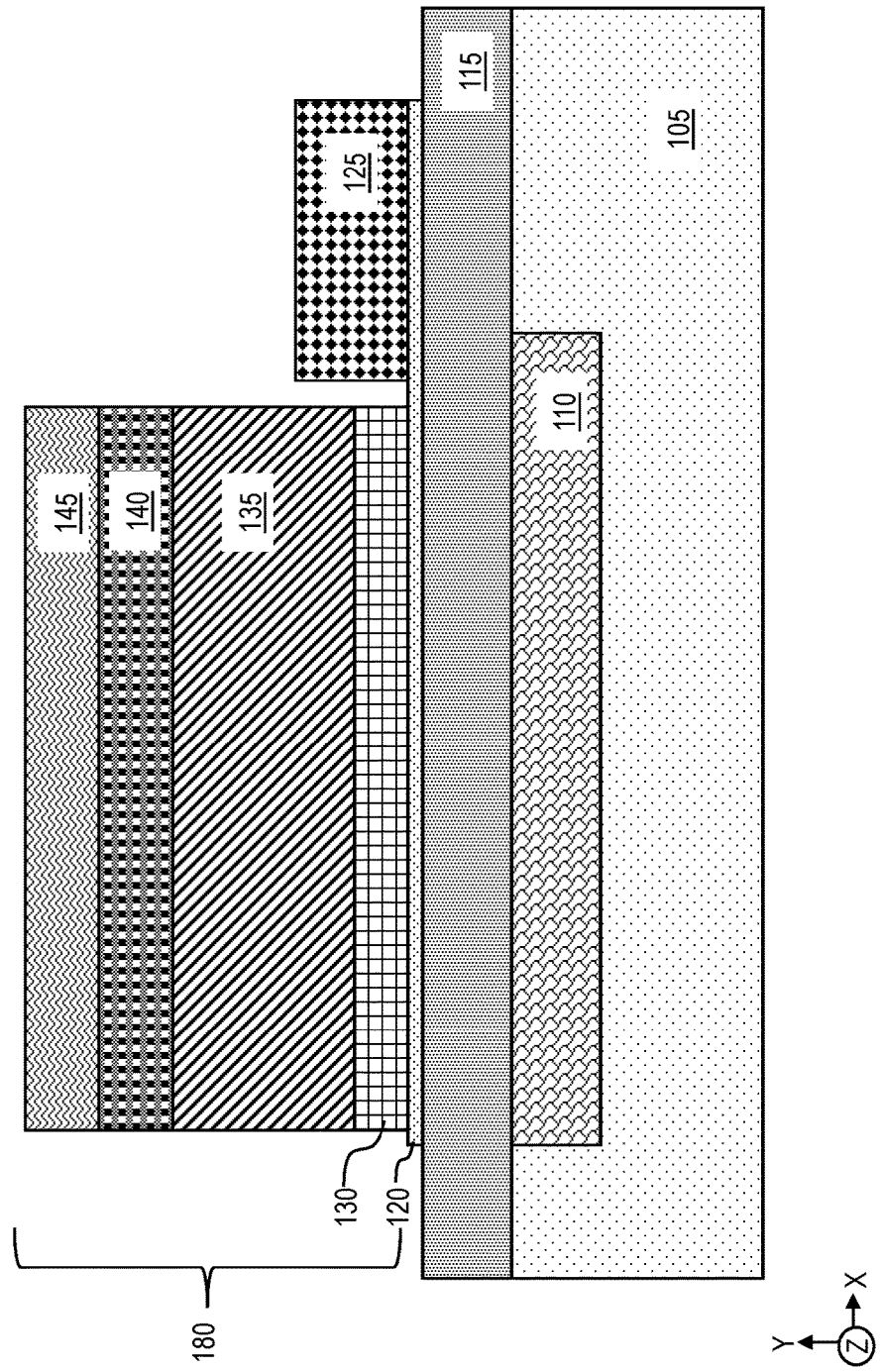
FIG. 7 is a cross-sectional view of the vertical device illustrating formation of the QDLED layers according to one or more embodiments.

FIG. 7 is a cross-sectional view of the vertical device 100 illustrating formation of the QDLED layers 180 by printing the layers 130, 135, 140, and 145 from their respective solution precursors. These layers 130, 135, 140, and 145 can be formed by either solution-based deposition processes such as spin casting and printing or vacuum-based deposition processes such as thermal evaporation and sputtering. For example, the hole transport layer 130 is deposited on top of the nanotube film 120. The quantum dots layer 135 is deposited on top of the hole transport layer 130. The hole blocking layer 140 is deposited on top of the quantum dots layer 135, and the electron transport layer 145 is deposited on top of the hole blocking layer 140.

As discussed above, FIG. 1 is a cross-sectional view of the vertical device 100 illustrating the deposition of the cathode layer 150. The cathode layer 150 is a contact. The cathode layer 150 can be formed by shadow evaporation.

Figure 8:
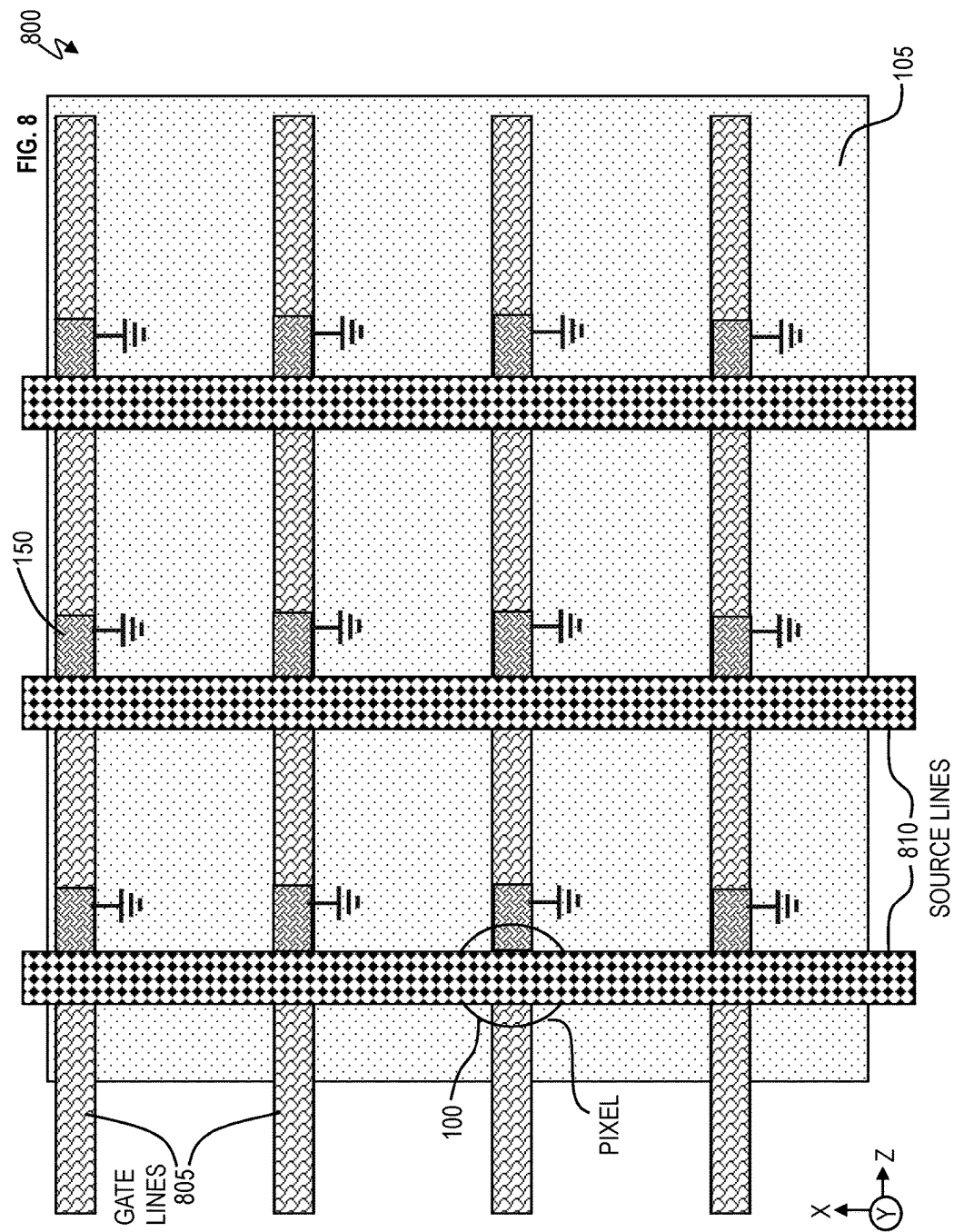
FIG. 8 is an example of an active matrix display of an array of vertical devices according to one or more embodiments.

FIG. 8 is an example of an active matrix display of an array of vertical devices 100 according to one or more embodiments. The active matrix display 800 is a top-down view.

The active matrix display 800 shows the embedded gates 110 as gate lines 805. The embedded gates 110 of different vertical devices 100 are connected to the gate lines 805. In this example, there are 4 gate lines 805 that run in the z-axis. Also, the matrix 800 shows the metal contacts 125 as source lines 810. The metal contacts 125 of different vertical devices 100 are connected to the source lines 810. In this example, there are 3 source lines 810 that run in the x-axis. The cathode 150 of the vertical devices 100 is depicted as being connected to ground.

Each of the gate lines 805 is in a row, and each of the source lines 810 is in a column of the active matrix 800. In this example, there are 12 vertical devices 100 formed at the intersection of the gate and source lines 805, 810. Each of the vertical devices 100 is a pixel (i.e., total of 12 pixels shown) that can be turned on to emit light and turned off so that no light is emitted. Although only 12 pixels (12 vertical devices 100) are shown for explanation purposes, it should be appreciated that the number of pixels (i.e., vertical devices 100) can be extended to any number as desired.

Figure 9:
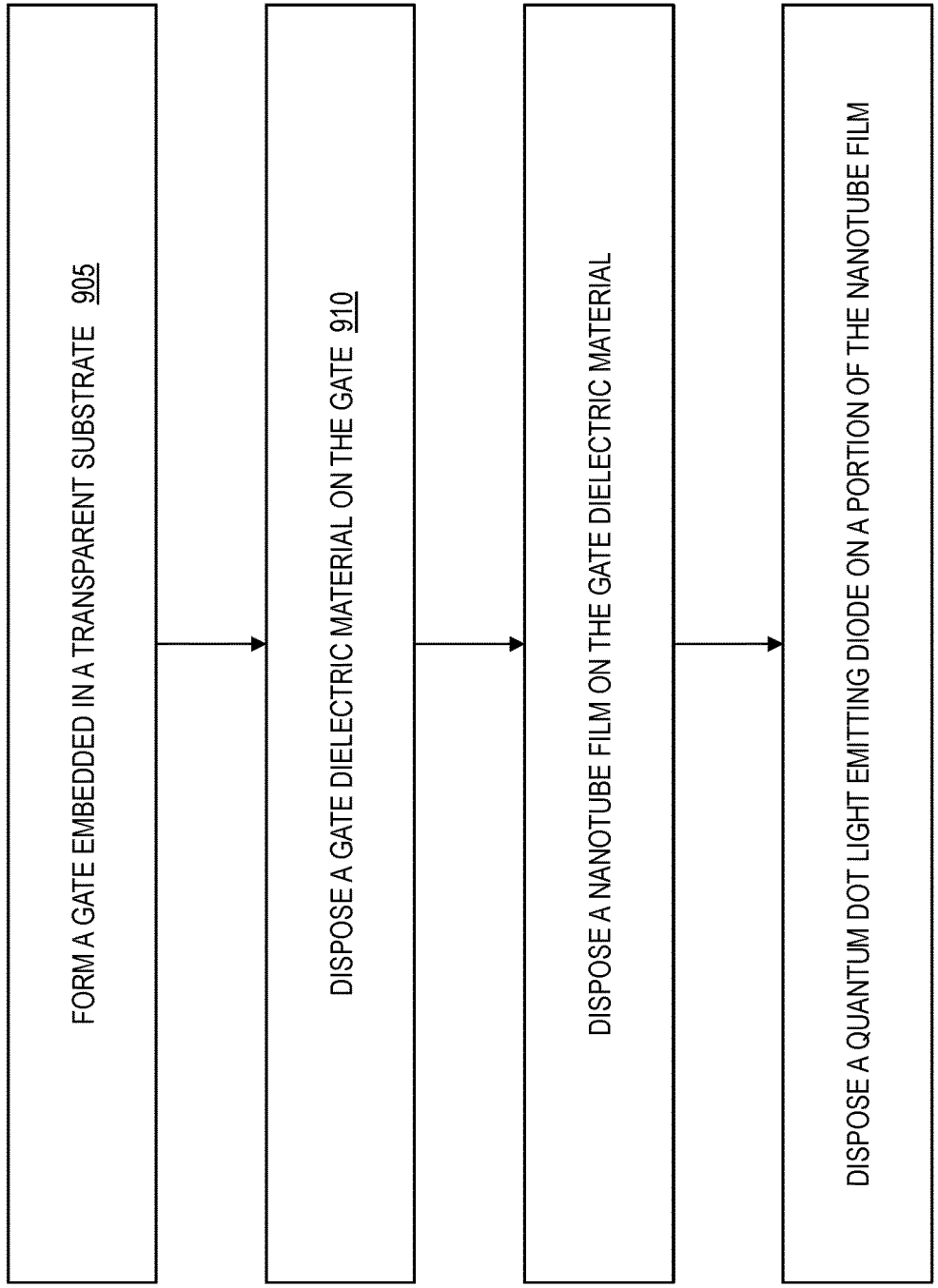
FIG. 9 is a flow chart of a method of forming a vertical device according to one or more embodiments.

FIG. 9 is a flow chart 900 of a method of forming a vertical device 100 according to one or more embodiments.

At block 905, a gate 110 is embedded in a transparent substrate 105. At block 910, a gate dielectric material 115 is disposed on top of the gate 110.

At block 915, a nanotube film layer 120 is disposed on top of the gate dielectric material 115. At block 920, a quantum dot light emitting diode 180 is disposed on top of a portion of the nanotube film layer 120.

A cathode layer 150 is disposed on top of the quantum dot light emitting diode 180. A metal contact 125 is disposed on top of another portion of the nanotube film layer 120 separate from quantum dot light emitting diode 180.

A combination of the gate 110, the gate dielectric material 115, the nanotube film 120, and the metal contact 125 together form a transistor 190, and the transistor 190 is vertically integrated with the quantum dot light emitting diode 180. The quantum dot light emitting diode 180 includes a quantum dots layer 135.

The quantum dot light emitting diode 180 includes a hole transport layer 130 disposed on top of the nanotube film 120, a quantum dots layer 135 disposed on top of the hole transport layer 130, a hole blocking layer 140 disposed on top of the quantum dots layer 135, an electron transport layer 145 disposed on top of the hole blocking layer 140.

The nanotube film 120 is a sheet of carbon nanotubes. The nanotube film 120 is a semiconductor, such that the nanotube film 120 is conductive when a voltage threshold is met (i.e., pixel turned on) and the nanotube film 120 is an insulator when the voltage threshold is not met (i.e., pixel turned off). A conductivity of the nanotube film 120 is configured to be controlled by the gate 110, such that the gate 110 is configured to turn on and turn off the quantum dot light emitting diode 180.

FIG. 10 is a flow chart 1000 of a matrix display 800 according to one or more embodiments.

At block 1005, an array of pixels is formed, each of the pixels includes a gate embedded 110 in a transparent substrate 105, a gate dielectric material 115 disposed on the gate 110, a nanotube film layer 120 disposed on the gate dielectric material 115, a quantum dot light emitting diode 180 disposed on a portion of the nanotube film layer 120, a cathode layer 150 disposed on the quantum dot light emitting diode 180, and a metal contact 125 disposed on another portion of the nanotube film 120.

At block 1010, gate lines 805 are formed in a first direction, and the gate lines 805 coupled to the array of pixels. At block 1015, source lines 810 are formed in a second direction, and the source lines 810 are coupled to the array of pixels.

The metal contact 125 is coupled to the source lines 810, such that current from the source voltage causes the quantum dot light emitting diode 180 to emit light. The gate 110 of the pixels is coupled to the gate lines 805 to control tuning of the nanotube film 120 between a conductive state and an insulation state, such that the conductive state conducts current from the source voltage thereby facilitating emission of the light while the insulation state conducts no current from source voltage thereby causing no light to be emitted.

Technical benefits include a method and structure to make a light emitting transistor based on semiconducting a nanotube thin film and quantum dot LEDs. The high mobility of nanotube thin films allows them to provide enough drive current for the QDLEDs. As technical benefits and advantages, the vertically integrated device structure allows easier integration into an active matrix because of its vertical configuration. The vertical device includes a submonolayer of semiconducting nanotubes as the anode of the QDLED. Technical benefits include a transparent nanotube film that does not block the light emitting from the quantum dots. The conductivity of the nanotube film can be tuned by an embedded local gate to effectively turn the pixel on or off of the quantum dots.

The term "about" and variations thereof are intended to include the degree of error associated with measurement of the particular quantity based upon the equipment available at the time of filing the application. For example, "about" can include a range of ±8% or 5%, or 2% of a given value.

It will be noted that various microelectronic device fabrication methods can be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation, or charge transfer doping. These doping processes are followed by furnace annealing or by rapid thermal annealing (RTA). Annealing serves to activate the implanted dopants.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments discussed herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

What is claimed is:

1. A vertical device comprising:
   a gate embedded in a transparent substrate;
   a gate dielectric material disposed on the gate, the transparent substrate is a separate layer from the gate dielectric material such that the gate is embedded within the transparent substrate;
   a nanotube film disposed on the gate dielectric material; and
   a quantum dot light emitting diode disposed on a portion of the nanotube film.

2. The vertical device of claim 1 further comprising a cathode layer disposed on the quantum dot light emitting diode.

3. The vertical device of claim 1 further comprising a metal contact disposed on another portion of the nanotube film.

4. The vertical device of claim 3, wherein a combination of the gate, the gate dielectric material, the nanotube film, and the metal contact together forms a transistor, the transistor being vertically integrated with the quantum dot light emitting diode.

5. The vertical device of claim 1, wherein the quantum dot light emitting diode includes a quantum dots layer.

6. The vertical device of claim 1, wherein the quantum dot light emitting diode includes a hole transport layer disposed on top of the nanotube film, a quantum dots layer disposed on top of the hole transport layer, a hole blocking layer disposed on top of the quantum dots layer, an electron transport layer disposed on top of the hole blocking layer.

7. The vertical device of claim 1, wherein the nanotube film is a sheet of carbon nanotubes.

8. The vertical device of claim 1, wherein the nanotube film is a semiconductor, such that the nanotube film is conductive when a voltage threshold is met and the nanotube film is an insulator when the voltage threshold is not met.

9. The vertical device of claim 1, wherein a conductivity of the nanotube film is configured to be controlled by the gate, such that the gate is configured to turn on and turn off the quantum dot light emitting diode.

10. A method of forming a vertical device, the method comprising:
  forming a gate embedded in a transparent substrate;
  disposing a gate dielectric material on the gate, the transparent substrate is a separate layer from the gate dielectric material such that the gate is embedded within the transparent substrate;
  disposing a nanotube film on the gate dielectric material; and
  disposing a quantum dot light emitting diode on a portion of the nanotube film.

11. The method of claim 10 further comprising disposing a cathode layer on the quantum dot light emitting diode.

12. The method of claim 11 further comprising disposing a metal contact on another portion of the nanotube film.

13. The method of claim 12, wherein a combination of the gate, the gate dielectric material, the nanotube film, and the metal contact together forms a transistor, the transistor being vertically integrated with the quantum dot light emitting diode.

14. The method of claim 10, wherein the quantum dot light emitting diode includes a quantum dots layer.

15. The method of claim 10, wherein the quantum dot light emitting diode includes a hole transport layer disposed on top of the nanotube film, a quantum dots layer disposed on top of the hole transport layer, a hole blocking layer disposed on top of the quantum dots layer, an electron transport layer disposed on top of the hole blocking layer.

16. The method of claim 10, wherein the nanotube film is a sheet of carbon nanotubes.

17. The method of claim 10, wherein the nanotube film is a semiconductor, such that the nanotube film is conductive when a voltage threshold is met and the nanotube film is an insulator when the voltage threshold is not met.

18. The method of claim 10, wherein a conductivity of the nanotube film is configured to be controlled by the gate, such that the gate is configured to turn on and turn off the quantum dot light emitting diode.

19. A matrix display comprising:
  an array of pixels, each pixel in the array of pixels including a gate embedded in a transparent substrate, a gate dielectric material disposed on the gate, a nanotube film disposed on the gate dielectric material, a quantum dot light emitting diode disposed on a portion of the nanotube film, a cathode layer disposed on the quantum dot light emitting diode, and a metal contact disposed on another portion of the nanotube film, wherein the transparent substrate is a separate layer from the gate dielectric material such that the gate is embedded within the transparent substrate;
  gate lines in a first direction, the gate lines coupled to the array of pixels; and
  source lines in a second direction, the source lines coupled to the array of pixels.

20. The matrix display of claim 19, wherein:
  the metal contact is coupled to the source lines, such that current from a source voltage causes the quantum dot light emitting diode to emit light; and
  the gate of each pixel in the array of pixels is coupled to the gate lines to control tuning of the nanotube film between a conductive state and an insulation state, such that the conductive state conducts the current thereby facilitating emission of the light while the insulation state conducts no current voltage thereby causing no light to be emitted.

* * * * *